US012751201B2

(12) United States Patent
Li et al.

(10) Patent No.: US 12,751,201 B2
(45) Date of Patent: Sep. 29, 2026

(54) ORGANIC COMPOUND, PEROVSKITE PRECURSOR SOLUTION, PEROVSKITE FILM, PEROVSKITE CELL, AND ELECTRIC APPARATUS

(71) Applicant: CONTEMPORARY AMPEREX TECHNOLOGY CO., LIMITED, Ningde (CN)

(72) Inventors: Hanfang Li, Ningde (CN); Shuojian Su, Ningde (CN); Weifeng Liang, Ningde (CN); Xiangling Lin, Ningde (CN); Zhaohui Liu, Ningde (CN); Guodong Chen, Ningde (CN); Yongsheng Guo, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 19/303,404

(22) Filed: Aug. 19, 2025

(65) Prior Publication Data

US 2025/0386725 A1 Dec. 18, 2025

Related U.S. Application Data

(63) Continuation of application No. PCT/CN2024/074359, filed on Jan. 29, 2024.

(30) Foreign Application Priority Data

Mar. 22, 2023 (CN) ........................ 202310286101.9

(51) Int. Cl.

*H10K 85/50* (2023.01)
*C07F 9/08* (2006.01)

(Continued)

(52) U.S. Cl.

CPC ............... *H10K 85/50* (2023.02); *C07F 9/08* (2013.01); *C07F 9/09* (2013.01); *C07F 9/141* (2013.01); *H10K 30/40* (2023.02)

(58) Field of Classification Search

CPC .......... H10K 85/50; H10K 30/40; C07F 9/08; C07F 9/09; C07F 9/141

See application file for complete search history.

(56) References Cited

U.S. PATENT DOCUMENTS

2019/0326065 A1 10/2019 Huang et al.
2022/0185765 A1* 6/2022 Misztal .................. H10K 85/30

FOREIGN PATENT DOCUMENTS

CN 101231353 A 7/2008
CN 101728550 A 6/2010

(Continued)

OTHER PUBLICATIONS

English translation of CN-114907260-A (Year: 2022).*

(Continued)

*Primary Examiner* — Kourtney R S Carlson
(74) *Attorney, Agent, or Firm* — XSENSUS LLP

(57) ABSTRACT

This application relates to an organic compound, a perovskite precursor solution, a perovskite film, a perovskite cell, and an electric apparatus. The organic compound includes: a cation M; and an anion Q bonded to the cation M; where M includes one or more of $CH_3NH_3^+$, $CH_5N_2^+$, $Cs^+$, and $C_2H_5NH_3^+$; and Q includes one or more of $H_2PO_x^-$ and $H_2NO_y^-$, where x and y are each independently an integer from 2 to 4.

13 Claims, 1 Drawing Sheet

(51) Int. Cl.

| | |
|---|---|
| ***C07F 9/09*** | (2006.01) |
| ***C07F 9/141*** | (2006.01) |
| ***H10K 30/40*** | (2023.01) |

(56) References Cited

FOREIGN PATENT DOCUMENTS

| | | | | | |
|---|---|---|---|---|---|
| CN | 103980208 | A | | 8/2014 | |
| CN | 113078267 | A | | 7/2021 | |
| CN | 114096511 | A | | 2/2022 | |
| CN | 114907260 | A | * | 8/2022 | .......... B01J 31/0298 |
| JP | 2008-513959 | A | | 5/2008 | |
| JP | 2016-189288 | A | | 11/2016 | |
| JP | 2022-528315 | A | | 6/2022 | |
| WO | 2022/031728 | A1 | | 2/2022 | |

OTHER PUBLICATIONS

Kogler, Matthias, and Berthold Stöger. "Hydrogen-bonding in mono-, di- and Tetramethylammonium Dihydrogenphosphites." Zeitschrift Für Kristallographie—Crystalline Materials, vol. 236, No. 1-2, Jan. 18, 2021, pp. 33-41, https://doi.org/10.1515/zkri-2020-0088. (Year: 2021).*

International Search Report and Written Opinion mailed on May 6, 2024, received for PCT Application PCT/CN2024/074359, filed on Jan. 29, 2024, 9 pages including English Translation.

Registration Document for registration No. RN171674-42-3, Dated: Dec. 22, 1995, 1 page.

Extended European Search Report issued Mar. 23, 2026 in European Patent Application No. 24773801.6.

Ebrahimi, Marzieh et al., "Performance enhancement of mesoscopic perovskite solar cells with GQDs-doped TiO2 electron transport layer", Solar Energy Materials and Solar Cells, Elsevier Science Publishers, Amsterdam, NL, vol. 208, Jan. 19, 2020.

Xiao, Zhengguo et al., "Unraveling the hidden function of a stabilizer in a precursor in improving hybrid perovskite film morphology for high efficiency solar cells", Energy & Environmental Science, vol. 9, No. 3, Jan. 1, 28, 2016, pp. 867-872.

Taddei, Margherita et al., "Ethylenediamine Addition Improves Performance and Suppresses Phase Instabilities in Mixed-Halide Perovskites", ACS Energy Letters, vol. 7, No. 12, Nov. 2, 2022, pp. 4265-4273.

Rana, Prem Jyoti Singh et al., "Alkali Additives Enable Efficient Large Area (>55 cm2) Slot-Die Coated Perovskite Solar Modules", Advanced Functional Materials, vol. 32, No. 22, Feb. 19, 2022.

Office Action issued May 12, 2026 in Japanese Patent Application No. 2025-537062 with English translation thereof.

Borchert, Juliane et al., Impurity Tracking Enables Enhanced Control and Reproducibility of Hybrid Perovskite Vapor Deposition, ACS Applied Materials & Interfaces, vol. 11, No. 32, pp. 28851-28857, Jul. 17, 2019, DOI: 10.1021/acsami.9b07619.

* cited by examiner

ORGANIC COMPOUND, PEROVSKITE PRECURSOR SOLUTION, PEROVSKITE FILM, PEROVSKITE CELL, AND ELECTRIC APPARATUS

CROSS-REFERENCE TO RELATED APPLICATIONS

This application is a Continuation of PCT/CN2024/074359, filed on Jan. 29, 2024, which claims priority to Chinese Patent Application No. 202310286101.9, filed on Mar. 22, 2023 and entitled "ORGANIC COMPOUND, PEROVSKITE PRECURSOR SOLUTION, PEROVSKITE FILM, PEROVSKITE CELL, AND ELECTRIC APPARATUS", each of which are incorporated herein by reference in their entirety.

TECHNICAL FIELD

This application relates to the technical field of solar cells, and in particular to, an organic compound, a perovskite precursor solution, a perovskite film, a perovskite cell, and an electric apparatus.

BACKGROUND

With the rapid development of the new energy field, solar cells have been widely applied in the fields of military, aerospace, industry, commerce, agriculture, communication, and the like. Perovskite cells have gradually become a hotspot in next-generation solar cell research due to their advantages such as high photoelectric conversion efficiency, simple fabrication processes, and low production costs and material costs. Currently, the long-term stability of perovskite cells is limited by the stability of their precursors, resulting in low long-term stability. Therefore, modifying the precursors to improve the long-term stability of perovskite cells is crucial for application of the perovskite cells.

SUMMARY

The purpose of this application is to provide an organic compound, a perovskite precursor solution, a perovskite film, a perovskite cell, and an electric apparatus, which can improve the long-term stability of the perovskite cell.

To achieve the above purpose, a first aspect of this application provides an organic compound, including: a cation M; and an anion Q bonded to the cation M; where the M includes one or more of methylammonium ion ($CH_3NH_3^+$), formamidinium ion ($CH_5N_2^+$), cesium ion ($Cs^+$), and ethylammonium ion ($C_2H_5NH_3^+$); and the Q includes one or more of $H_2PO_x^-$ and $H_2NO_y^-$, where x and y are each independently an integer from 2 to 4.

The organic compound provided by this application includes the anion Q. When used as an additive (passivator) in a perovskite cell, particularly in the preparation of a perovskite layer, the anion Q can interact with a perovskite intermediate phase before annealing of the perovskite layer, slowing down a nucleation and crystallization speed, reducing grain boundary defects, achieving in-situ passivation of defects at the grain boundaries, reducing the generation of recombination sites at the grain boundaries, and extending carrier lifetime, thereby improving the photoelectric conversion efficiency and long-term stability of the perovskite cell.

In some embodiments of this application, the organic compound includes one or more of methylammonium hypophosphite ($MAH_2PO_2$), formamidinium hypophosphite ($FAH_2PO_2$), cesium hypophosphite ($CsH_2PO_2$), ethylammonium hypophosphite ($C_2H_5NH_3H_2PO_2$), methylammonium phosphite ($MAH_2PO_3$), formamidinium phosphite ($FAH_2PO_3$), cesium phosphite ($CsH_2PO_3$), ethylammonium phosphite ($C_2H_5NH_3H_2PO_3$), methylammonium phosphate ($MAH_2PO_4$), formamidinium phosphate ($FAH_2PO_4$), cesium phosphate ($CsH_2PO_4$), ethylammonium phosphate ($C_2H_5NH_3H_2PO_4$), $MAH_2NO_2$, $FAH_2NO_2$, $CsH_2NO_2$, $C_2H_5NH_3H_2NO_2$, $MAH_2NO_3$, $FAH_2NO_3$, $CsH_2NO_3$, $C_2H_5NH_3H_2NO_3$, $MAH_2NO_4$, $FAH_2NO_4$, $CsH_2NO_4$, and $C_2H_5NH_3H_2NO_4$.

In some embodiments of this application, the organic compound includes one or more of $CH_3NH_3H_2PO_4$, $CH_5N_2H_2PO_4$, $CsH_2PO_4$, $C_2H_5NH_3H_2PO_4$, $CH_3NH_3H_2PO_3$, and $CH_3NH_3H_2PO_2$.

A second aspect of this application further provides a perovskite precursor solution, including the organic compound described in the first aspect of this application and a perovskite precursor material.

The perovskite precursor solution provided by this application contains the organic compound of the first aspect of this application, that is, the organic compound is added as an additive (passivator) to the perovskite precursor solution. The perovskite precursor solution being used to prepare a perovskite material can slow down a nucleation and crystallization speed, reduce grain boundary defects, achieve in-situ passivation of defects at the grain boundaries, reduce the generation of recombination sites at the grain boundaries, and extend carrier lifetime, thereby improving the photoelectric conversion efficiency and long-term stability of a perovskite cell.

In some embodiments of this application, the perovskite precursor material includes an organic halide $ABX_3$, where A includes one or more of $CH_3NH_3^+$, $CH_5N_2^+$, $Cs^+$, and $C_2H_5NH_3^+$, B includes one or more of Pb, Sn, and Ge, and X includes one or more of $F^-$, $Cl^-$, $Br^-$, and $I^-$.

In some embodiments of this application, A includes one or more of $CH_5N_2^+$, $C_2H_5NH_3^+$, and $Cs^+$.

In some embodiments of this application, B includes Pb.

In some embodiments of this application, X includes $Br^-$ and $I^-$.

In some embodiments of this application, the organic halide includes $FA_{1-x'}Cs_{x'}Pb(I_{1-y'}Br_{y'})_3$, where $0<x'<1$, and $0<y'<1$.

In some embodiments of this application, a molar concentration of the organic halide in the perovskite precursor solution is 0.5 mol/L to 3 mol/L, and a molar concentration of the organic compound in the perovskite precursor solution is $0.0008\times10^{-2}$ mol/L to 0.18 mol/L.

In some embodiments of this application, the molar concentration of the organic halide in the perovskite precursor solution is 0.8 mol/L to 1.5 mol/L.

In some embodiments of this application, the molar concentration of the organic compound in the perovskite precursor solution is $0.003\times10^{-2}$ mol/L to 0.1 mol/L.

In some embodiments of this application, the molar concentration of the organic compound in the perovskite precursor solution is $0.01\times10^{-2}$ mol/L to 0.01 mol/L.

In some embodiments of this application, in the perovskite precursor solution, a ratio of the molar concentration of the organic halide to the molar concentration of the organic compound is 100:(0.0008-12).

In some embodiments of this application, in the perovskite precursor solution, the ratio of the molar concentration of the organic halide to the molar concentration of the organic compound is 100:(0.001-10).

In some embodiments of this application, in the perovskite precursor solution, the ratio of the molar concentration of the organic halide to the molar concentration of the organic compound is 100:(0.003-5).

The molar concentration of the organic halide in the perovskite precursor solution falling within the above range can provide sufficient organic luminescent materials for a perovskite layer in the perovskite cell, thereby providing sufficient photoelectrons to maintain a relatively high luminous efficiency of the perovskite cell.

In some embodiments of this application, the perovskite precursor solution further includes an organic solvent, where the organic solvent includes one or more of N,N-dimethylformamide, dimethyl sulfoxide, N-methylpyrrolidone, acetonitrile, 2-mercaptoethanol, and 1-methyl-2-pyrrolidone.

A third aspect of this application provides a perovskite film prepared and formed from the precursor solution described in the second aspect of this application.

The perovskite film provided by this application is prepared from a perovskite precursor solution containing the aforementioned organic compound and perovskite precursor material. Therefore, when used in a perovskite cell, the perovskite film exhibits effects similar to those of the aforementioned perovskite precursor solution, which are not repeated here.

A fourth aspect of this application provides a perovskite cell, including a perovskite layer, where the perovskite layer includes the perovskite film of the third aspect of this application.

In some embodiments of this application, a thickness of the perovskite layer is 150 nanometers (nm) to 600 nm.

The perovskite layer serves as a light absorption layer, that is, an active layer of the perovskite cell. The layer is a core position of the entire cell structure. The thickness of the perovskite layer falling within this range can further improve the photoelectric conversion efficiency and long-term stability of the perovskite cell.

A fifth aspect of this application provides an electric apparatus, including the perovskite cell of the fourth aspect of this application.

The electric apparatus of this application includes the perovskite cell provided by this application and thus has at least the same advantages as the perovskite cell.

BRIEF DESCRIPTION OF DRAWINGS

To describe the technical solutions in the embodiments of this application more clearly, the following briefly describes the accompanying drawings required for describing the embodiments of this application. Apparently, the accompanying drawings in the following description show merely some embodiments of this application, and persons of ordinary skill in the art may still derive other drawings from the accompanying drawings without creative efforts. In the drawings.

Figure 1:
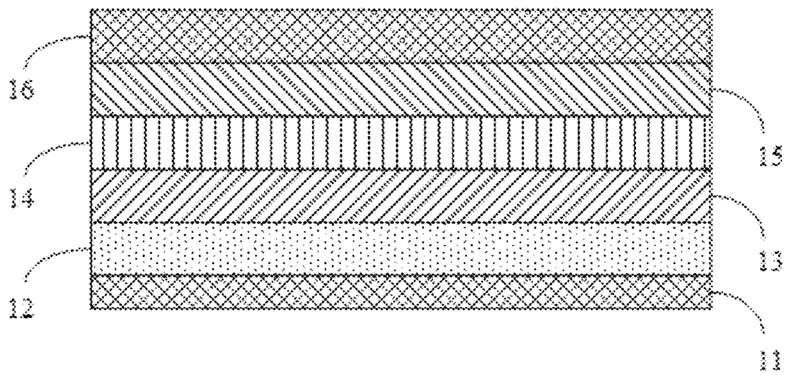
FIG. 1 is a schematic structural diagram of a perovskite cell according to an embodiment of this application.

Reference signs: 11. transparent substrate layer; 12. transparent conductive layer; 13. first charge transport layer; 14. perovskite layer; 15. second charge transport layer; and 16. back electrode layer.

DESCRIPTION OF EMBODIMENTS

Embodiments that specifically disclose an organic compound, a perovskite precursor solution, a perovskite film, a perovskite cell, and an electric apparatus of this application are described in detail below with appropriate reference to the drawings. However, unnecessary detailed descriptions may be omitted. For example, detailed descriptions of well-known matters or repetitive descriptions of substantially identical structures may be omitted. This is to avoid unnecessarily prolonging the following description, for ease of understanding by persons skilled in the art. Furthermore, the drawings and the following description are provided to enable persons skilled in the art to fully understand this application and are not intended to limit the subject matter recited in the claims.

"Ranges" disclosed in this application are defined in the form of lower and upper limits. A given range is defined by one lower limit and one upper limit selected, where the selected lower and upper limits define boundaries of that particular range. Ranges defined in this way may or may not include end values, and any combination may be used, meaning that any lower limit may be combined with any upper limit to form a range. For example, if ranges of 60-120 and 80-110 are provided for a specific parameter, it is understood that ranges of 60-110 and 80-120 can also be envisioned. In addition, if minimum values of a range are given as 1 and 2, and maximum values of the range are given as 3, 4, and 5, the following ranges can all be envisioned: 1-3, 1-4, 1-5, 2-3, 2-4, and 2-5. In this application, unless otherwise specified, a value range of "a-b" is a short representation of any combination of real numbers between a and b, where both a and b are real numbers. For example, a value range of "0-5" means that all real numbers in the range of "0-5" are listed herein, and "0-5" is just an abbreviated representation of a combination of these numbers. In addition, a parameter expressed as an integer greater than or equal to 2 is equivalent to disclosure that the parameter is, for example, an integer among 2, 3, 4, 5, 6, 7, 8, 9, 10, 11, 12, and so on.

Unless otherwise specified, all embodiments and optional embodiments of this application may be combined with each other to form new technical solutions.

Unless otherwise specified, all technical features and optional technical features of this application may be combined with each other to form new technical solutions.

Unless otherwise specified, all the steps in this application can be performed in the order described or in random order, preferably, in the order described. For example, a method including steps (a) and (b) indicates that the method may include steps (a) and (b) performed in order or may include steps (b) and (a) performed in order. For example, the foregoing method may further include step (c), which indicates that step (c) may be added to the method in any ordinal position, for example, the method may include steps (a), (b), and (c), steps (a), (c), and (b), steps (c), (a), and (b), or the like.

Unless otherwise specified, "include" and "contain" mentioned in this application is inclusive or may be exclusive. For example, the terms "include" and "contain" can mean that other unlisted components may also be included or contained, or only listed components are included or contained.

In the description of some embodiments of this application, the technical terms "first aspect", "second aspect", "third aspect", "fourth aspect", and the like are merely intended for description, and shall not be understood as any indication or implication of relative importance or any implicit indication of the importance or quantity of the technical features indicated. Moreover, "first", "second", "third", "fourth", and the like are used only for non-exhaustive enumeration and description purposes and should be understood as not constituting a closed limitation on quantity.

Unless otherwise specified, in this application, the term "or" is inclusive. For example, a phrase "A or B" means "A, B, or both A and B". More specifically, any of the following conditions satisfies the condition "A or B": A is true (or present) and B is false (or not present); A is false (or not present) and B is true (or present); or both A and B are true (or present).

Currently, in a perovskite cell, the crystallization quality of a perovskite layer is critical to the performance of the perovskite cell. Defects at grain boundaries provide recombination sites, shortening carrier lifetime and severely affecting the performance of the perovskite cell. To address this, this application provides an organic compound. By adding the organic compound as an additive (passivator) to a perovskite precursor solution and using an in-situ passivation approach, a nucleation and crystallization process of the perovskite layer is regulated to achieve in-situ passivation of defects at the grain boundaries, thereby improving the long-term stability of the perovskite cell.

Organic Compound

A first aspect of this application provides an organic compound MQ, including: a cation, M; and an anion, Q bonded to the cation M; where the M includes one or more of $CH_3NH_3^+$ [$MA^+$], $CH_5N_2^+$ [$FA^+$], $Cs^+$, and $C_2H_5NH_3^+$, and the Q includes one or more of $H_2PO_x^-$ and $H_2NO_y^-$, where x and y are each independently an integer from 2 to 4.

It can be understood that M may be only one of the above cations or may include several of the above cations; and when M includes several of the above cations, in each MQ molecule, the total number of atoms of various cations is 1.

As a non-limiting example, when M includes $CH_3NH_3^+$ [$MA^+$] and $CH_5N_2^+$ [$FA^+$], the total number of atoms of two cations [$MA^+$] and [$FA^+$] is 1.

Without intending to be bound by any theory, the organic compound provided by this application includes a cation M and an anion Q. When used as an additive (passivator) in a perovskite cell, particularly in the preparation of a perovskite layer, the cation M can provide the cation required for photoelectric conversion in the perovskite layer; the anion Q can interact with a perovskite intermediate phase (for example, an MAI-$PbI_2$-DMSO phase) formed in a perovskite precursor solution (typically containing an organic halide $ABX_3$ and an organic solvent) before annealing of the perovskite layer, that is, interacting with the cation in the perovskite intermediate phase, thereby slowing down the volatilization of the cation during the subsequent crystallization process, suppressing nucleation, slowing down a crystallization speed, and reducing grain boundary defects, thereby achieving in-situ passivation of grain boundary defects, reducing the generation of recombination sites at the grain boundaries, extending carrier lifetime, and improving the photoelectric conversion efficiency and long-term stability of the perovskite cell.

In some embodiments, the above organic compound may include one or more of $MAH_2PO_2$, $FAH_2PO_2$, $CsH_2PO_2$, $C_2H_5NH_3H_2PO_2$, $MAH_2PO_3$, $FAH_2PO_3$, $CsH_2PO_3$, $C_2H_5NH_3H_2PO_3$, $MAH_2PO_4$, $FAH_2PO_4$, $CsH_2PO_4$, $C_2H_5NH_3H_2PO_4$, $MAH_2NO_2$, $FAH_2NO_2$, $CsH_2NO_2$, $C_2H_5NH_3H_2NO_2$, $MAH_2NO_3$, $FAH_2NO_3$, $CsH_2NO_3$, $C_2H_5NH_3H_2NO_3$, $MAH_2NO_4$, $FAH_2NO_4$, $CsH_2NO_4$, and $C_2H_5NH_3H_2NO_4$.

In some embodiments, the above organic compound includes one or more of $CH_3NH_3H_2PO_4$, $CH_5N_2H_2PO_4$, $CsH_2PO_4$, $C_2H_5NH_3H_2PO_4$, $CH_3NH_3H_2PO_3$, and $CH_3NH_3H_2PO_2$.

This application selects the above types of organic compounds, where the cations in the organic compounds are selected from the cation types typically included in the perovskite layer of the perovskite cell, providing more cations for the realization of photoelectric conversion in the perovskite layer; the anions selected from the organic compounds can further improve the photoelectric conversion efficiency and long-term stability of the perovskite cell by interacting with the perovskite intermediate phase (for example, the MAI-$PbI_2$-DMSO phase) before annealing of the perovskite layer.

As a non-limiting example, the above organic compound can be prepared by the following method:

A crystallized and dried round-bottom flask is used, and a methylamine ethanol solution and ethanol are added and stirred in an ice-water bath until the solution is cooled to 0-5° C. A phosphoric acid is additionally taken and dropwise added to the round-bottom flask, then reaction is performed in the ice-water bath, allowing the solution to be slowly heated to room temperature; and then the solvent is removed by rotary evaporation. Then, the resulting product is dispersed in ethanol and washed repeatedly with diethyl ether to obtain an organic compound methylammonium phosphate ($MAH_2PO_4$).

A second aspect of this application provides a perovskite precursor solution, including the organic compound of the first aspect of this application and a perovskite precursor material.

The perovskite precursor solution provided by this application contains the organic compound of the first aspect of this application, that is, the organic compound is added as an additive (passivator) to the perovskite precursor solution. The perovskite precursor solution being used to prepare a perovskite material, the cation M in the organic compound can provide the cation required for photoelectric conversion in a light-absorbing layer containing the perovskite material; the anion Q can interact with an intermediate phase (for example, an MAI-$PbI_2$-DMSO phase) formed in the perovskite precursor material, that is, interacting with the cation in the perovskite intermediate phase, slowing down the volatilization of the cation during the subsequent crystallization process, suppressing nucleation, slowing down a crystallization speed, and reducing grain boundary defects, thereby achieving in-situ passivation of grain boundary defects, reducing the generation of recombination sites at the grain boundaries, extending carrier lifetime, and improving the photoelectric conversion efficiency and long-term stability of the perovskite layer in the perovskite cell.

In some embodiments, a molar concentration of the organic compound in the perovskite precursor solution is $0.0008\times10^{-2}$ mol/L to 0.18 mol/L.

In some embodiments, the molar concentration of the organic compound in the perovskite precursor solution is $0.003\times10^{-2}$ mol/L to 0.1 mol/L.

In some embodiments, the molar concentration of the organic compound in the perovskite precursor solution is $0.01\times10^{-2}$ mol/L to 0.01 mol/L.

In some embodiments, in the perovskite precursor solution, a ratio of a molar concentration of an organic halide to the molar concentration of the organic compound is 100:(0.0008-12). For example, the molar concentration ratio may be 100:0.0008, 100:0.001, 100:0.003, 100:0.005, 100:0.007, 100:0.01, 100:0.03, 100:0.05, 100:0.07, 100:0.1, 100:0.3, 100:0.5, 100:0.7, 100:1, 100:3, 100:5, 100:7, 100:10, or 100:12, or falls within a range defined by any of the above values.

In some embodiments, in the perovskite precursor solution, the ratio of the molar concentration of the organic halide to the molar concentration of the organic compound is 100:(0.001-10).

In some embodiments, the molar concentration ratio is 100:(0.003-5).

The molar concentration of the organic compound in the perovskite precursor solution and the ratio of the molar concentration of the organic compound to the molar concentration of the organic halide falling within the above ranges, before annealing of the perovskite, is conducive to further facilitating the interaction between the anion Q in the organic compound and the perovskite intermediate phase (for example, the MAI-$PbI_2$-DMSO phase), that is, further facilitating the interaction between the anion Q and the cation in the perovskite intermediate phase, slowing down the volatilization of the cation during the subsequent crystallization process, suppressing nucleation, slowing down a crystallization speed, and reducing grain boundary defects, thereby achieving in-situ passivation of grain boundary defects, reducing the generation of recombination sites at the grain boundaries, extending carrier lifetime, and further improving the photoelectric conversion efficiency and long-term stability of the perovskite layer in the perovskite cell.

In some embodiments, the perovskite precursor material includes an organic halide $ABX_3$, where A includes one or more of $CH_3NH_3^+$, $CH_5N_2^+$, $Cs^+$, and $C_2H_5NH_3^+$, B includes one or more of Pb, Sn, and Ge, and X includes one or more of $F^-$, $Cl^-$, $Br^-$, and $I^-$.

In some embodiments, A includes one or more of $CH_5N_2^+$, $C_2H_5NH_3^+$, and $Cs^+$.

In some embodiments, B includes Pb.

In some embodiments, X includes $Br^-$ and $I^-$.

It should be noted that in the above organic compound provided by this application, the cation M includes the cation type A of the organic halide $ABX_3$.

In some embodiments, the organic halide includes $FA_{1-x'}Cs_{x'}Pb(I_{1-y'}Br_{y'})_3$, where 0<x'<1, and 0<y'<1.

In some embodiments, a molar concentration of the organic halide in the perovskite precursor solution is 0.5 mol/L to 3 mol/L. For example, the molar concentration of the organic halide in the perovskite precursor solution may be 0.5 mol/L, 0.7 mol/L, 0.9 mol/L, 1.1 mol/L, 1.3 mol/L, 1.5 mol/L, 1.7 mol/L, 1.9 mol/L, 2.1 mol/L, 2.3 mol/L, 2.5 mol/L, 2.7 mol/L, 2.9 mol/L, or 3 mol/L, or falls within in range defined by any of the above values.

In some embodiments, the molar concentration of the organic halide in the perovskite precursor solution is 0.8 mol/L to 1.5 mol/L.

The molar concentration of the organic halide in the perovskite precursor solution falling within the above range can provide sufficient organic luminescent materials for a perovskite layer in the perovskite cell, thereby providing sufficient photoelectrons to maintain a relatively high luminous efficiency (photoelectric conversion efficiency) of the perovskite cell.

In some embodiments, the perovskite precursor solution further includes an organic solvent, where the organic solvent includes one or more of N,N-dimethylformamide, dimethyl sulfoxide, N-methylpyrrolidone, acetonitrile, 2-mercaptoethanol, and 1-methyl-2-pyrrolidone.

The perovskite precursor solution contains the above types of organic solvents, where the above organic solvents can form an intermediate phase complex with the organic halide component in the perovskite precursor solution. For example, when the organic solvent is dimethyl sulfoxide and the organic halide is $MAPbI_3$, an MAI-$PbI_2$-DMSO intermediate phase complex can be formed. The cation in this intermediate phase complex can interact with the anion Q in the organic compound. For example, $Pb^{2+}$ in the intermediate phase complex can interact with the anion Q in the organic compound to form coordination bonds, slowing down the volatilization of the cation in the organic halide during the subsequent crystallization process, suppressing nucleation, slowing down a crystallization speed, and reducing grain boundary defects, thereby achieving in-situ passivation of grain boundary defects, reducing the generation of recombination sites at the grain boundaries, extending carrier lifetime, and further improving the photoelectric conversion efficiency and long-term stability of the perovskite cell.

It can be understood that the above organic solvent may be used alone or several organic solvents are used in combination. When several organic solvents are used in combination, a volume ratio of the several solvents can be adjusted based on different components and molar concentrations.

A third aspect of this application provides a perovskite film prepared and formed from the precursor solution described in the second aspect of this application.

The perovskite film provided by this application is prepared from a perovskite precursor solution containing the aforementioned organic compound and perovskite precursor material. Therefore, when used in a perovskite cell, the perovskite film exhibits effects similar to those of the aforementioned perovskite precursor solution, which are not repeated here.

A fourth aspect of this application further provides a method for preparing a perovskite film. The method may include the following steps:

S10: Load the perovskite precursor solution described in the second aspect of this application onto a substrate.

S20: Perform an annealing treatment on the perovskite precursor solution to obtain the perovskite film.

By loading the perovskite precursor solution onto the substrate and performing an annealing treatment, the organic solvent in the perovskite precursor solution can be removed, and the nucleation and crystal growth of the organic halide can be achieved.

In some embodiments, the annealing treatment includes: heating the perovskite precursor solution at 70 degrees Celsius (° C.) to 200° C. for 3 minutes (min) to 60 min.

In some embodiments, the temperature of the above annealing treatment may be 70° C., 90° C., 110° C., 130° C., 150° C., 170° C., 190° C., or 200° C., or falls within a range defined by any of the above values.

In some embodiments, the time of the above annealing treatment may be 3 min, 6 min, 9 min, 15 min, 20 min, 25 min, 30 min, 35 min, 40 min, 45 min, 50 min, 55 min, or 60 min, or falls within a range defined by any of the above values.

The temperature and time of the annealing treatment falling within the above ranges can achieve removal of the organic solvent in the perovskite precursor solution and allow for better nucleation and crystal growth processes of the organic halide, reducing grain boundary defects, reducing the generation of recombination sites at the grain boundaries, and extending carrier lifetime, thereby improving the photoelectric conversion efficiency and long-term stability of the perovskite cell.

In some embodiments, the type of the substrate in the above step S10 is not particularly limited and can be selected based on actual needs. For example, the substrate may be one or more of transparent glass, polyethylene terephthalate (PET), polyimide substrate, and the like.

In some embodiments, in the above step S10, methods such as vacuum extraction may be used to load the perovskite precursor solution onto the substrate, thereby forming the perovskite film.

Optionally, when the vacuum extraction method is used, the vacuum extraction time is controlled to be 0.5 min to 10 min. For example, the vacuum extraction time may be 0.5 min, 1 min, 2 min, 3 min, 4 min, 5 min, 6 min, 7 min, 8 min, 9 min, or 10 min, or falls within a range defined by any of the above values.

Perovskite Cell

A fifth aspect of this application provides a perovskite cell. As shown in FIG. 1, the perovskite cell includes a perovskite layer 14, and the perovskite layer 14 includes the perovskite film of the fourth aspect of this application.

In some embodiments, a thickness of the perovskite layer is 150 nm to 600 nm. For example, the thickness of the perovskite layer may be 150 nm, 200 nm, 250 nm, 300 nm, 350 nm, 400 nm, 450 nm, 500 nm, 550 nm, or 600 nm, or falls within a range defined by any of the above values.

The perovskite layer serves as a light absorption layer, that is, an active layer of the perovskite cell. The layer is a core position of the entire cell structure. The thickness of the perovskite layer falling within this range can further improve the photoelectric conversion efficiency and long-term stability of the perovskite cell.

In some embodiments, the perovskite cell may be a conventional perovskite cell or an inverted perovskite cell.

In some embodiments, as shown in FIG. 1, the perovskite cell further includes a transparent substrate layer 11, a transparent conductive layer 12, a first charge transport layer 13, a second charge transport layer 15, and a back electrode layer 16 that are stacked.

In some embodiments, the transparent substrate layer 11 serves as the support for the cell, and its light transparency and strength need to meet the requirements of the perovskite cell. The transparent substrate layer may include at least one of transparent glass, polyethylene terephthalate (PET), and polyimide (PI) substrates. A thickness of the transparent substrate layer 11 is 0.5 millimeters (mm) to 5 mm. For example, the thickness of the transparent substrate layer may be 0.5 mm, 1 mm, 1.5 mm, 2 mm, 2.5 mm, 3 mm, 3.5 mm, 4 mm, 4.5 mm, or 5 mm, or falls within a range defined by any of the above values.

In some embodiments, the transparent conductive layer 12 serves as an anode layer, plays a role in collecting holes, and is capable of conducting photo-generated carriers, and filtering ultraviolet light that is destructive to the perovskite layer while achieving electricity conduction.

In some embodiments, the transparent conductive layer may include at least one of fluorine-doped tin oxide (FTO), indium tin oxide (ITO), aluminum-doped zinc oxide (AZO), boron-doped zinc oxide (BZO), indium zinc oxide (IZO), and indium tungsten oxide (IWO).

In some embodiments, a thickness of the transparent conductive layer 12 is 200 nm to 1000 nm. For example, the thickness of the transparent conductive layer may be 200 nm, 300 nm, 400 nm, 500 nm, 600 nm, 700 nm, 800 nm, 900 nm, or 1000 nm, or falls within a range defined by any of the above values.

In some embodiments, the first charge transport layer 13 may be a hole transport layer or an electron transport layer. The second charge transport layer 15 may be a hole transport layer or an electron transport layer. The electron transport layer serves to extract electrons and block holes, while the hole transport layer serves to transport holes and block electrons.

In some embodiments, a thickness of the first charge transport layer is 10 nm to 100 nm. For example, the thickness of the first charge transport layer may be 10 nm, 20 nm, 30 nm, 40 nm, 50 nm, 60 nm, 70 nm, 80 nm, 90 nm, or 100 nm, or falls within a range defined by any of the above values.

In some embodiments, a thickness of the second charge transport layer is 10 nm to 100 nm. For example, the thickness of the second charge transport layer may be 10 nm, 20 nm, 30 nm, 40 nm, 50 nm, 60 nm, 70 nm, 80 nm, 90 nm, or 100 nm, or falls within a range defined by any of the above values.

It can be understood that the first charge transport layer 13 and the second charge transport layer 15 are typically configured differently. That is, when the first charge transport layer 13 is an electron transport layer, the second charge transport layer 15 is a hole transport layer, and the perovskite cell corresponds to a conventional perovskite cell. When the first charge transport layer 13 is a hole transport layer, the second charge transport layer 15 is an electron transport layer, and the perovskite cell corresponds to an inverted perovskite cell.

In some embodiments, a material of the electron transport layer may include one or more of the following materials and their derivatives: imide compounds, quinone compounds, fullerenes and their derivatives, methoxy triphenylamine-fluorinated formamidine (OMeTPA-FA), calcium titanate ($CaTiO_3$), lithium fluoride (LiF), calcium fluoride ($CaF_2$), poly(3,4-ethylenedioxythiophene):polystyrene sulfonate (PEDOT:PSS), poly(3-hexylthiophene) (P3HT), triptycene-core triphenylamine (H101), 3,4-ethylenedioxythiophene-methoxy triphenylamine (EDOT-OMeTPA), N-(4-aniline)carbazole-spirobifluorene (CzPAF-SBF), [6,6]-phenyl-C61-butyric acid methyl ester (PCBM), polythiophene, metal oxides, silicon oxide ($SiO_2$), tin oxide ($SnO_2$), strontium titanate ($SrTO_3$), copper thiocyanate (CuSCN), and the like; where the metal element may include one or more of Mg, Ni, Cd, Zn, In, Pb, Mo, W, Sb, Bi, Cu, Hg, Ti, Ag, Mn, Fe, V, Sn, Zr, Sr, Ga, and Cr.

In some embodiments, a material of the hole transport layer may include at least one of the following materials and their derivatives: 2,2',7,7'-tetrakis[N,N-di(4-methoxyphenyl)amino]-9,9'-spirobifluorene (Spiro-OMeTAD), polytriarylamine (PTAA), NiOx, poly(3,4-ethylenedioxythiophene):polystyrene sulfonate (PEDOT:PSS), Me-4PACz, MeO-2PACz, $WO_3$, and the like.

In some embodiments, the back electrode layer serves as a cathode layer and has a function of collecting free electrons.

In some embodiments, the back electrode layer is typically an organic, inorganic, or organic-inorganic hybrid conductive material, including at least one of indium tin oxide (ITO), lanthanide-doped indium oxide, boron-doped zinc oxide (BZO), aluminum zinc oxide (AZO), indium zinc oxide (IZO), gallium zinc oxide (GZO), indium tungsten oxide (IWO), Au, Ag, Cu, Al, Ni, Cr, Bi, Pt, Mg, Mo, W and alloys thereof, graphite, graphene, and carbon nanotubes, optionally Ag, Cu, C, Au, Al, ITO, AZO, BZO, or IZO, and further optionally Cu, Ag, Au, or combinations thereof.

In some embodiments, a thickness of the back electrode layer is 20 nm to 200 nm. For example, the thickness of the back electrode layer may be 20 nm, 40 nm, 60 nm, 80 nm, 100 nm, 120 nm, 140 nm, 160 nm, 180 nm, or 200 nm, or falls within a range defined by any of the above values.

A sixth aspect of this application further provides a method for preparing a perovskite cell. The method may include the following steps:

S10': Provide a substrate for a perovskite cell, where the substrate includes transparent conductive glass and a first charge transport layer stacked on the transparent conductive glass.

S20': Prepare the perovskite precursor solution described in the second aspect of this application.

S30': Load the precursor solution onto the substrate and remove an organic solvent from the precursor solution to obtain a perovskite layer.

S40': Prepare a second charge transport layer and a back electrode layer sequentially stacked on the perovskite layer to obtain a perovskite cell.

It can be understood that the sequence number of the above steps is merely for an exemplary illustration of the method for preparing a perovskite cell and does not necessarily limit the sequence of the steps.

In some embodiments, the above first charge transport layer, perovskite layer, and second charge transport layer may be prepared by a spin-coating method.

Additionally, a seventh aspect of this application further provides an electric apparatus, where the electric apparatus includes the perovskite cell provided by this application. The perovskite cell serves as a power source for the electric apparatus. The electric apparatus may include a mobile device (for example, a mobile phone or a notebook computer), an electric vehicle (for example, a battery electric vehicle, a hybrid electric vehicle, a plug-in hybrid electric vehicle, an electric bicycle, an electric scooter, an electric golf cart, or an electric truck), an electric train, a ship, and a satellite, and a power generation system, but is not limited thereto.

Figure 2:
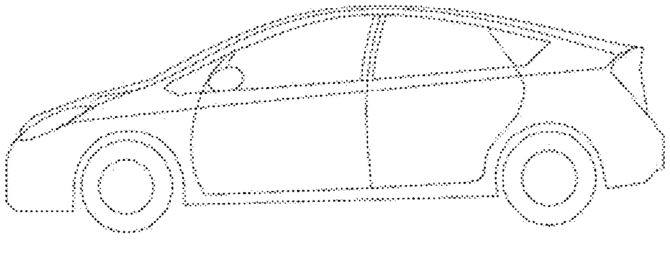
FIG. 2 is a schematic diagram of an electric apparatus using a perovskite cell as a power source according to an embodiment of this application.

FIG. 2 is an electric apparatus as an example. The electric apparatus is a battery electric vehicle, a hybrid electric vehicle, a plug-in hybrid electric vehicle, or the like. As another example, the apparatus may be a mobile phone, a tablet computer, a notebook computer, or the like. Such apparatus is typically required to be thin and lightweight and may use a perovskite cell as its power source.

EXAMPLES

Examples of this application are described below. The examples described below are illustrative and only used for explaining this application, and cannot be construed as limitations on this application. Examples whose technical solutions or conditions are not specified are made in accordance with technical solutions or conditions described in literature in the field, or made in accordance with product instructions. The reagents or instruments used are all conventional products that are commercially available if no manufacturer is indicated.

Example 1

Preparation of Organic Compound:

A crystallized and dried round-bottom flask was used, and 9.5 g of a methylamine ethanol solution (0.096 mol, a concentration of methylamine ethanol solution was 30 wt % to 33 wt %) and 100 mL of ethanol were added and stirred in an ice-water bath for 10 min until the solution was cooled to 0-5° C. 9.8 g (0.1 mol) of phosphoric acid was additionally taken and dropwise added to the round-bottom flask, then reaction was performed in the ice-water bath for 3 h, allowing the solution to be slowly heated to room temperature (25° C.); and then the solvent was removed by rotary evaporation. Then, the resulting product was dispersed in ethanol and washed repeatedly with diethyl ether to obtain white particles of methylammonium phosphate ($MAH_2PO_4$).

Preparation of Perovskite Cell:

(a) A piece of FTO conductive glass with a size of 5 cm×5 cm was used and subjected to laser ablation to leave an insulating region. Then, the conductive glass was sequentially subjected to ultrasonic treatment with deionized water, detergent, ethanol, isopropanol, acetone, ethanol, and deionized water for 20 min, then dried with $N_2$, and was used as a transparent conductive layer for use.

(b) An $NiO_x$ nanoparticle solution was spin-coated onto the above transparent conductive layer at a speed of 3000 rpm, annealed at 200° C. for 15 min, and cooled naturally to obtain an electron transport layer with a thickness of 10 nm.

(c) Methylammonium phosphate (with a molar concentration of 0.01 mol/L, where a concentration ratio of methylammonium phosphate to the Pb element in $FA_{0.9}Cs_{0.1}PbI_3$ was 1:100) was added to an $FA_{0.9}Cs_{0.1}PbI_3$ perovskite precursor solution with a molar concentration of 1 mol/L and stirred to prepare a perovskite precursor solution, and the solution was sealed for use.

(d) The surface of an $NiO_x$ substrate after treated with ultraviolet ozone for 15 min was purged. Then, an appropriate amount of the perovskite precursor solution was taken and spin-coated at a rotation speed of 4000 rpm for 20 s to prepare a wet film, subjected to vacuum extraction for 30 s, annealed on a hot plate at 120° C. for 45 min, and then cooled naturally to obtain a perovskite layer with a thickness of 500 nm.

(e) A PCBM solution was spin-coated onto the perovskite layer at a rotation speed of 3000 rpm to form a hole transport layer with a thickness of 80 nm.

(f) A thermal evaporation was used, and a mask with a specified pattern was used to deposit a Cu counter electrode on the hole transport layer, to form a back electrode layer with a thickness of 100 nm; and then a perovskite cell was obtained.

Example 2

The technical solution of this example was substantially the same as that of Example 1, except that in step (c), the molar concentration of methylammonium phosphate ($MAH_2PO_4$) was $0.01\times10^{-2}$ mol/L.

Example 3

The technical solution of this example was substantially the same as that of Example 1, except that in step (c), the molar concentration of methylammonium phosphate ($MAH_2PO_4$) was $0.003\times10^{-2}$ mol/L.

Example 4

The technical solution of this example was substantially the same as that of Example 1, except that in step (c), the molar concentration of methylammonium phosphate ($MAH_2PO_4$) was 0.05 mol/L.

Example 5

The technical solution of this example was substantially the same as that of Example 1, except that in step (c), the molar concentration of methylammonium phosphate ($MAH_2PO_4$) was 0.1 mol/L.

Example 6

The technical solution of this example was substantially the same as that of Example 1, except that in the preparation of the organic compound, phosphoric acid was replaced with hypophosphorous acid, where the molar ratio of hypophosphorous acid to methylamine in the methylamine ethanol solution was 1:1.1, to obtain methylammonium hypophosphite ($MAH_2PO_2$); and in step (c), the molar concentration of methylammonium hypophosphite was $0.003\times10^{-2}$ mol/L.

Example 7

The technical solution of this example was substantially the same as that of Example 1, except that in the preparation of the organic compound, phosphoric acid was replaced with an equal mass of phosphorous acid to obtain methylammonium phosphite ($MAH_2PO_3$); and in step (c), the molar concentration of methylammonium phosphite was $0.003\times10^{-2}$ mol/L.

Example 8

The technical solution of this example was substantially the same as that of Example 1, except that in the preparation of the organic compound, the methylamine ethanol solution was replaced with an equal mass of formamidinium acetate to obtain formamidinium phosphate ($FAH_2PO_4$); and in step (c), the molar concentration of formamidinium phosphate was $0.003\times10^{-2}$ mol/L.

Example 9

The technical solution of this example was substantially the same as that of Example 1, except that in the preparation of the organic compound, the methylamine ethanol solution was replaced with an equal mass of cesium carbonate to obtain cesium phosphate ($CsH_2PO_4$); and in step (c), the molar concentration of cesium phosphate was $0.003\times10^{-2}$ mol/L.

Example 10

The technical solution of this example was substantially the same as that of Example 1, except that in the preparation of the organic compound, the methylamine ethanol solution was replaced with an equal mass of ethylamine to obtain $C_2H_5NH_3H_2PO_4$; and in step (c), the molar concentration of $C_2H_5NH_3H_2PO_4$ was $0.003\times10^{-2}$ mol/L.

Example 11

The technical solution of this example was substantially the same as that of Example 1, except that in step (c), the molar concentration of methylammonium phosphate ($MAH_2PO_4$) was $0.001\times10^{-2}$ mol/L.

Example 12

The technical solution of this example was substantially the same as that of Example 1, except that in step (c), the molar concentration of $FA_{0.9}Cs_{0.1}PbI_3$ was 0.5 mol/L.

Example 13

The technical solution of this example was substantially the same as that of Example 1, except that in step (c), the molar concentration of $FA_{0.9}Cs_{0.1}PbI_3$ was 3 mol/L.

Example 14

The technical solution of this example was substantially the same as that of Example 1, except that in step (c), the molar concentration of $FA_{0.9}Cs_{0.1}PbI_3$ was 0.8 mol/L, and the molar concentration of methylammonium phosphate ($MAH_2PO_4$) was $0.0008\times10^{-2}$ mol/L.

Example 15

The technical solution of this example was substantially the same as that of Example 1, except that in step (c), the molar concentration of $FA_{0.9}Cs_{0.1}PbI_3$ was 1.5 mol/L, and the molar concentration of methylammonium phosphate ($MAH_2PO_4$) was 0.18 mol/L.

Example 16

The technical solution of this example was substantially the same as that of Example 1, except that in step (c), $FA_{0.9}Cs_{0.1}PbI_3$ was replaced with an equal molar amount of $(C_2H_5NH_3)_{0.9}Cs_{0.1}PbI_3$.

Example 17

The technical solution of this example was substantially the same as that of Example 1, except that in step (c), $FA_{0.9}Cs_{0.1}PbI_3$ was replaced with an equal molar amount of $MA_{0.8}Cs_{0.2}PbI_3$.

Example 18

The technical solution of this example was substantially the same as that of Example 1, except that in step (c), $MAH_2PO_4$ was replaced with an equal molar amount of $MAH_2NO_4$.

Example 19

The technical solution of this example was substantially the same as that of Example 1, except that in step (c), $MAH_2PO_4$ was replaced with an equal molar amount of $MAH_2NO_3$.

Example 20

The technical solution of this example was substantially the same as that of Example 1, except that in step (c), $MAH_2PO_4$ was replaced with an equal molar amount of $MAH_2NO_2$.

Example 21

The technical solution of this example was substantially the same as that of Example 1, except that in step (d), the thickness of the perovskite layer was 160 nm.

Example 22

The technical solution of this example was substantially the same as that of Example 1, except that in step (d), the thickness of the perovskite layer was 600 nm.

Comparative Example 1

The technical solution of this example was substantially the same as that of Example 1, except that in step (c), no organic compound was added.

Comparative Example 2

The technical solution of this example was substantially the same as that of Example 1, except that in step (c), $MAH_2NO_4$ was replaced with an equal molar amount of MAI.

The relevant parameters of the organic compounds, perovskite precursor solutions, and perovskite cells of the above Examples 1 to 22 and Comparative examples 1 and 2 are shown in Table 1 below.

TABLE 1

| | Perovskite precursor solution | | | | | Perovskite |
|---|---|---|---|---|---|---|
| | Organic compound | | Organic halide | | Ratio of molar concentration of organic halide to molar concentration of organic compound | cell Thickness of perovskite layer (nm) |
| Group | Type | Molar concentration (mol/L) | Type | Molar concentration (mol/L) | | |
| Example 1 | $MAH_2PO_4$ | 0.01 | $FA_{0.9}Cs_{0.1}PbI_3$ | 1 | 100:1 | 500 |
| Example 2 | $MAH_2PO_4$ | $0.01 \times 10^{-2}$ | $FA_{0.9}Cs_{0.1}PbI_3$ | 1 | 100:0.01 | 500 |
| Example 3 | $MAH_2PO_4$ | $0.003 \times 10^{-2}$ | $FA_{0.9}Cs_{0.1}PbI_3$ | 1 | 100:0.003 | 500 |
| Example 4 | $MAH_2PO_4$ | 0.05 | $FA_{0.9}Cs_{0.1}PbI_3$ | 1 | 100:5 | 500 |
| Example 5 | $MAH_2PO_4$ | 0.1 | $FA_{0.9}Cs_{0.1}PbI_3$ | 1 | 100:10 | 500 |
| Example 6 | $MAH_2PO_2$ | $0.003 \times 10^{-2}$ | $FA_{0.9}Cs_{0.1}PbI_3$ | 1 | 100:0.003 | 500 |
| Example 7 | $MAH_2PO_3$ | $0.003 \times 10^{-2}$ | $FA_{0.9}Cs_{0.1}PbI_3$ | 1 | 100:0.003 | 500 |
| Example 8 | $FAH_2PO_4$ | $0.003 \times 10^{-2}$ | $FA_{0.9}Cs_{0.1}PbI_3$ | 1 | 100:0.003 | 500 |
| Example 9 | $CsH_2PO_4$ | $0.003 \times 10^{-2}$ | $FA_{0.9}Cs_{0.1}PbI_3$ | 1 | 100:0.003 | 500 |
| Example 10 | $C_2H_5NH_3H_2PO_4$ | $0.003 \times 10^{-2}$ | $FA_{0.9}Cs_{0.1}PbI_3$ | 1 | 100:0.003 | 500 |
| Example 11 | $MAH_2PO_4$ | $0.001 \times 10^{-2}$ | $FA_{0.9}Cs_{0.1}PbI_3$ | 1 | 100:0.001 | 500 |
| Example 12 | $MAH_2PO_4$ | 0.008 | $FA_{0.9}Cs_{0.1}PbI_3$ | 0.5 | 100:1 | 500 |
| Example 13 | $MAH_2PO_4$ | 0.015 | $FA_{0.9}Cs_{0.1}PbI_3$ | 3 | 100:1 | 500 |
| Example 14 | $MAH_2PO_4$ | $0.0008 \times 10^{-2}$ | $FA_{0.9}Cs_{0.1}PbI_3$ | 0.8 | 100:0.0008 | 500 |
| Example 15 | $MAH_2PO_4$ | 0.18 | $FA_{0.9}Cs_{0.1}PbI_3$ | 1.5 | 100:12 | 500 |
| Example 16 | $MAH_2PO_4$ | 0.01 | $(C_2H_5NH_3)_{0.9}Cs_{0.1}PbI_3$ | 1 | 100:1 | 500 |
| Example 17 | $MAH_2PO_4$ | 0.01 | $MA_{0.8}Cs_{0.2}PbI_3$ | 1 | 100:1 | 500 |
| Example 18 | $MAH_2NO_4$ | 0.01 | $FA_{0.9}Cs_{0.1}PbI_3$ | 1 | 100:1 | 500 |
| Example 19 | $MAH_2NO_3$ | 0.01 | $FA_{0.9}Cs_{0.1}PbI_3$ | 1 | 100:1 | 500 |
| Example 20 | $MAH_2NO_2$ | 0.01 | $FA_{0.9}Cs_{0.1}PbI_3$ | 1 | 100:1 | 500 |
| Example 21 | $MAH_2PO_4$ | 0.01 | $FA_{0.9}Cs_{0.1}PbI_3$ | 1 | 100:1 | 150 |
| Example 22 | $MAH_2PO_4$ | 0.01 | $FA_{0.9}Cs_{0.1}PbI_3$ | 1 | 100:1 | 600 |
| Comparative example 1 | / | 0.01 | $FA_{0.9}Cs_{0.1}PbI_3$ | 1 | / | 500 |
| Comparative example 2 | MAI | 0.01 | $FA_{0.9}Cs_{0.1}PbI_3$ | 1 | 100:1 | 500 |

Additionally, the perovskite cells obtained from the above Examples 1 to 22 and Comparative examples 1 and 2 were subjected to relevant performance tests, with the test results shown in Tables 2 and 3 below.

Tests (1) Test of Photoelectric Conversion Efficiency

Under normal temperature and pressure, a solar simulator light source was used as an AM1.5G standard light source (AM 1.5G, 100 mW/cm$^2$), a volt-ampere characteristic curve of a component under light source irradiation was measured using a four-channel digital source meter (Keithley 2440) to obtain an open-circuit voltage Voc, a short-circuit current density Jsc, and a fill factor FF (Fill Factor) of the component, so that the photoelectric conversion efficiency PCE (Efficiency) of the component was obtained.

"Normal temperature and pressure" referred to: a normal pressure, where the temperature was 25° C. and the pressure was one atmosphere; and a normal temperature, where the temperature was 20° C. to 30° C. and might further be 25° C.

(2) Stability Test

After the test, the cell was placed in an atmospheric environment (with relative humidity of 85% and an ambient temperature of approximately 15-40° C.). After the cell was exposed to light for at least 200 hours, the photoelectric conversion efficiency was tested again, and then a difference between the component efficiency after placed in the atmosphere for 200 hours and an initial efficiency was calculated. A decrease in the photoelectric conversion efficiency was a ratio of the difference to the initial efficiency and was used as the performance parameter for the stability of the component.

TABLE 2

| | Initial performance | | | | Performance after placed for 200 h | | | |
|---|---|---|---|---|---|---|---|---|
| Group | Voc (V) | Jsc (mA/cm$^2$) | FF (%) | PCE (%) | Voc (V) | Jsc (mA/cm$^2$) | FF (%) | PCE (%) |
| Example 1 | 1.04 | 24.54 | 78.62 | 20.07 | 1.02 | 24.07 | 78.31 | 19.23 |
| Example 2 | 1.02 | 22.14 | 77.92 | 17.60 | 1.01 | 21.05 | 76.62 | 16.29 |
| Example 3 | 1.01 | 20.78 | 74.87 | 15.71 | 1 | 20.01 | 73.22 | 14.65 |
| Example 4 | 1.01 | 21.6 | 74.06 | 16.16 | 0.99 | 20.96 | 72.55 | 15.05 |
| Example 5 | 0.98 | 21.04 | 73.21 | 15.10 | 0.98 | 20.93 | 70.11 | 14.38 |
| Example 6 | 1 | 21.35 | 73.56 | 15.71 | 0.98 | 20.88 | 71.34 | 14.60 |
| Example 7 | 0.99 | 22.95 | 70.89 | 16.11 | 0.95 | 22.06 | 69.98 | 14.67 |
| Example 8 | 1.04 | 23.16 | 78.12 | 18.82 | 1.03 | 23.05 | 77.94 | 18.50 |
| Example 9 | 1.02 | 22.34 | 74.96 | 17.08 | 1.01 | 21.55 | 73.21 | 15.93 |
| | | | | | 1.01 | | | |
| Example 10 | 1 | 20.48 | 73.49 | 15.05 | 0.99 | 19.83 | 73.07 | 14.34 |
| Example 11 | 1 | 20.83 | 76.53 | 15.94 | 1 | 19.96 | 75.69 | 15.11 |
| Example 12 | 1.02 | 23.41 | 79.62 | 19.01 | 1.01 | 22.89 | 77.43 | 17.90 |
| Example 13 | 1.01 | 24.02 | 77.32 | 18.76 | 1 | 23.65 | 75.03 | 17.74 |
| Example 14 | 1.02 | 23.07 | 78.34 | 18.43 | 1.01 | 22.48 | 75.06 | 17.04 |
| Example 15 | 1 | 23.78 | 75.43 | 17.94 | 1 | 22.99 | 72.63 | 16.70 |
| Example 16 | 1.01 | 22.84 | 73.22 | 16.89 | 0.99 | 21.49 | 71.14 | 15.14 |
| Example 17 | 1.01 | 23.92 | 76.68 | 18.53 | 1 | 23.43 | 73.39 | 17.20 |
| Example 18 | 1 | 22.43 | 76.98 | 17.27 | 1 | 23.09 | 74.57 | 17.22 |
| Example 19 | 0.99 | 21.76 | 75.33 | 16.23 | 0.97 | 20.97 | 73.46 | 14.94 |
| Example 20 | 1 | 21.98 | 76.28 | 16.77 | 0.98 | 21.32 | 72.99 | 15.25 |
| Example 21 | 1.03 | 22.31 | 78.06 | 17.94 | 1 | 21.97 | 77.98 | 17.13 |
| Example 22 | 1 | 24.07 | 76.53 | 18.42 | 0.99 | 23.54 | 75.22 | 17.53 |
| Comparative example 1 | 1.02 | 20.08 | 75.57 | 15.48 | 0.99 | 19.03 | 72.44 | 13.65 |
| Comparative example 2 | 0.99 | 21.45 | 72.99 | 15.50 | 0.95 | 19.69 | 71.3 | 13.34 |

TABLE 3

| Group | Initial photoelectric conversion efficiency (%) | Photoelectric conversion efficiency of component after placed for 200 h (%) | Decrease in photoelectric conversion efficiency (%) |
|---|---|---|---|
| Example 1 | 20.07 | 19.23 | 4.18 |
| Example 2 | 17.60 | 16.29 | 7.43 |
| Example 3 | 15.71 | 14.65 | 6.76 |
| Example 4 | 16.16 | 15.05 | 6.82 |
| Example 5 | 15.10 | 14.38 | 4.74 |
| Example 6 | 15.71 | 14.60 | 7.05 |
| Example 7 | 16.11 | 14.67 | 8.95 |
| Example 8 | 18.82 | 18.50 | 1.66 |
| Example 9 | 17.08 | 15.93 | 6.71 |
| Example 10 | 15.05 | 14.34 | 4.69 |
| Example 11 | 15.94 | 15.11 | 5.23 |
| Example 12 | 19.01 | 17.90 | 5.84 |
| Example 13 | 18.76 | 17.74 | 5.40 |
| Example 14 | 18.43 | 17.04 | 7.55 |
| Example 15 | 17.94 | 16.70 | 6.91 |
| Example 16 | 16.89 | 15.14 | 10.39 |
| Example 17 | 18.53 | 17.20 | 7.18 |
| Example 18 | 17.27 | 17.22 | 0.28 |
| Example 19 | 16.23 | 14.94 | 7.92 |
| Example 20 | 16.77 | 15.25 | 9.04 |
| Example 21 | 17.94 | 17.13 | 4.49 |
| Example 22 | 18.42 | 17.53 | 4.84 |
| Comparative example 1 | 15.48 | 13.65 | 11.83 |
| Comparative example 2 | 15.50 | 13.34 | 13.95 |

In the above Tables 1 to 3, it can be seen from comparison of the examples with Comparative example 1 that when the organic compound provided by this application is not added to the perovskite layer, the decrease in photoelectric conversion efficiency of the perovskite cell after placed for 200 his significantly higher than that in the examples, indicating that adding the organic compound provided by this application to the perovskite precursor solution for preparing the perovskite cell can improve the photoelectric conversion efficiency and long-term stability of the perovskite cell. It can be seen from comparison of the examples with Comparative example 2 that after the anion Q in the organic compound of this application is replaced with another type of anion (for example, $I^-$ in Comparative example 2), the decrease in photoelectric conversion efficiency of the perovskite cell is also significantly higher, indicating that the anion in the organic compound of this application indeed plays a significant role in improving the photoelectric conversion efficiency and long-term stability of the perovskite cell.

It should be noted that this application is not limited to the above embodiments. The foregoing embodiments are merely examples, and embodiments having substantially the same constructions and the same effects as the technical idea within the scope of the technical solutions of this application are all included in the technical scope of this application. In addition, without departing from the essence of this application, various modifications made to the embodiments that can be conceived by persons skilled in the art, and other manners constructed by combining some of the constituent elements in the embodiments are also included in the scope of this application.

The invention claimed is:

1. A perovskite precursor solution, comprising:

an organic compound; and a perovskite precursor material, wherein the organic compound comprises:

a cation M; and an anion Q bonded to the cation M, wherein the M comprises one or more of $CH_3NH_3^+$, $CH_5N_2^+$, $Cs^+$, and $C_2H_5NH_3^+$; and the Q comprises one or more of $H_2PO_x^-$ and $H_2NO_y^-$, wherein y is an integer from 2 to 4 and x is 4.

2. The perovskite precursor solution according to claim 1, wherein the perovskite precursor material comprises an organic halide $ABX_3$, wherein A comprises one or more of $CH_3NH_3^+$, $CH_5N_2^+$, $Cs^+$, and $C_2H_5NH_3^+$, B comprises one or more of Pb, Sn, and Ge, X comprises one or more of F, Cl, Br, and I.

3. The perovskite precursor solution according to claim 2, wherein the organic halide comprises $FA_{1-x'}Cs_{x'}Pb(I_{1-y'}Br_{y'})_3$, wherein 0<x'<1, and 0<y'<1.

4. The perovskite precursor solution according to claim 2, wherein:

a molar concentration of the organic halide in the perovskite precursor solution is 0.5 mol/L to 3 mol/L; and a molar concentration of the organic compound in the perovskite precursor solution is $0.0008\times10^{-2}$ mol/L to 0.18 mol/L.

5. The perovskite precursor solution according to claim 2, wherein a molar concentration of the organic halide in the perovskite precursor solution is 0.8 mol/L to 1.5 mol/L.

6. The perovskite precursor solution according to claim 1, wherein a molar concentration of the organic compound in the perovskite precursor solution is $0.003\times10^{-2}$ mol/L to 0.1 mol/L.

7. The perovskite precursor solution according to claim 1, wherein a molar concentration of the organic compound in the perovskite precursor solution is $0.01\times10^{-2}$ mol/L to 0.01 mol/L.

8. The perovskite precursor solution according to claim 2, wherein in the perovskite precursor solution, a ratio of a molar concentration of the organic halide to a molar concentration of the organic compound is 100:(0.0008-12).

9. The perovskite precursor solution according to claim 1, wherein the perovskite precursor solution further comprises an organic solvent;

wherein the organic solvent comprises one or more of N,N-dimethylformamide, dimethyl sulfoxide, N-methylpyrrolidone, acetonitrile, 2-mercaptoethanol, and 1-methyl-2-pyrrolidone.

10. A perovskite film prepared and formed from the perovskite precursor solution according to claim 4.

11. A perovskite cell, comprising a perovskite layer, wherein the perovskite layer comprises the perovskite film according to claim 10.

12. The perovskite cell according to claim 11, wherein a thickness of the perovskite layer is 150 nm to 600 nm.

13. An electric apparatus, comprising the perovskite cell according to claim 11.

* * * * *